(12) United States Patent
Chih et al.

(10) Patent No.: US 12,367,932 B2
(45) Date of Patent: Jul. 22, 2025

(54) MEMORY DEVICE IN WHICH LATCH IS COUPLED TO SOURCE LINE AND METHOD OF OPERATION

(71) Applicant: Taiwan Semiconductor Manufacturing Company Limited, Hsin-Chu (TW)

(72) Inventors: Yu-Der Chih, Hsin-Chu (TW); Cheng-Hsiung Kuo, Jhubei (TW); Chung-Chieh Chen, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 18/218,415

(22) Filed: Jul. 5, 2023

(65) Prior Publication Data

US 2023/0343396 A1    Oct. 26, 2023

Related U.S. Application Data

(63) Continuation of application No. 16/884,137, filed on May 27, 2020, now Pat. No. 11,742,024.

(51) Int. Cl.
*G11C 16/08* (2006.01)
*G11C 16/10* (2006.01)
*G11C 16/14* (2006.01)
*G11C 16/26* (2006.01)

(52) U.S. Cl.
CPC .............. *G11C 16/08* (2013.01); *G11C 16/10* (2013.01); *G11C 16/14* (2013.01); *G11C 16/26* (2013.01); *G11C 2216/04* (2013.01)

(58) Field of Classification Search
None
See application file for complete search history.

(56) References Cited

U.S. PATENT DOCUMENTS

| | | | |
|---|---|---|---|
| 5,748,538 A | 5/1998 | Lee et al. | |
| 5,898,637 A | 4/1999 | Lakhani et al. | |
| 5,986,934 A | 11/1999 | Kao et al. | |
| 6,639,842 B1* | 10/2003 | Hoang | G11C 16/12 365/185.28 |
| 6,765,825 B1 | 7/2004 | Scott | |
| 9,564,238 B1* | 2/2017 | Bai | G11C 16/08 |
| 2004/0240273 A1 | 12/2004 | Sakui | |
| 2016/0148684 A1 | 5/2016 | Lin et al. | |
| 2016/0240259 A1* | 8/2016 | Chih | G11C 16/26 |

(Continued)

FOREIGN PATENT DOCUMENTS

| | | |
|---|---|---|
| CN | 101373635 A | 2/2009 |
| CN | 110050306 A | 7/2019 |

(Continued)

OTHER PUBLICATIONS

Corresponding Korean Patent Application No. 10-2020-0109684, Notice of Allowance dated Dec. 14, 2021. English Translation.

*Primary Examiner* — Alfredo Bermudez Lozada
(74) *Attorney, Agent, or Firm* — Cooper Legal Group, LLC

(57) ABSTRACT

A memory device includes a column of at least three memory cells and a source line coupled to the source terminal of each memory cell. A source line driver is coupled to the source line, a voltage terminal, and a program voltage source and is switchable between a program operation, an erase operation, and a read operation.

20 Claims, 9 Drawing Sheets

(56) References Cited

U.S. PATENT DOCUMENTS

2016/0336074 A1   11/2016  Tanaka et al.
2017/0194056 A1    7/2017  Heinrich-Barna et al.
2017/0301401 A1* 10/2017  Maeda .................. G11C 5/144

FOREIGN PATENT DOCUMENTS

| KR | 20150068482 A | 6/2015 |
| KR | 20160099455 A | 8/2016 |
| KR | 20180042421 A | 4/2018 |
| KR | 20190002708 A | 1/2019 |
| KR | 20190002711 A | 1/2019 |
| KR | 20200032746 A | 3/2020 |
| WO | 2011136965 A1 | 11/2011 |

* cited by examiner

MEMORY DEVICE IN WHICH LATCH IS COUPLED TO SOURCE LINE AND METHOD OF OPERATION

CROSS-REFERENCE TO RELATED APPLICATIONS

This application is a continuation of and claims priority to U.S. patent application Ser. No. 16/884,137, titled "MEMORY DEVICE COMPRISING SOURCE LINE COUPLED TO MULTIPLE MEMORY CELLS AND METHOD OF OPERATION (As Amended)" and filed on May 27, 2020, which is incorporated herein by reference.

BACKGROUND

Memory devices are classified into volatile memory devices and non-volatile memory devices. Volatile memory devices are typically configured to store data by charging or discharging capacitors in memory cells. Non-volatile memory devices maintain stored data even when disconnected from a power source. Floating gate memory is a type of non-volatile memory that uses voltages to program and erase data in a memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
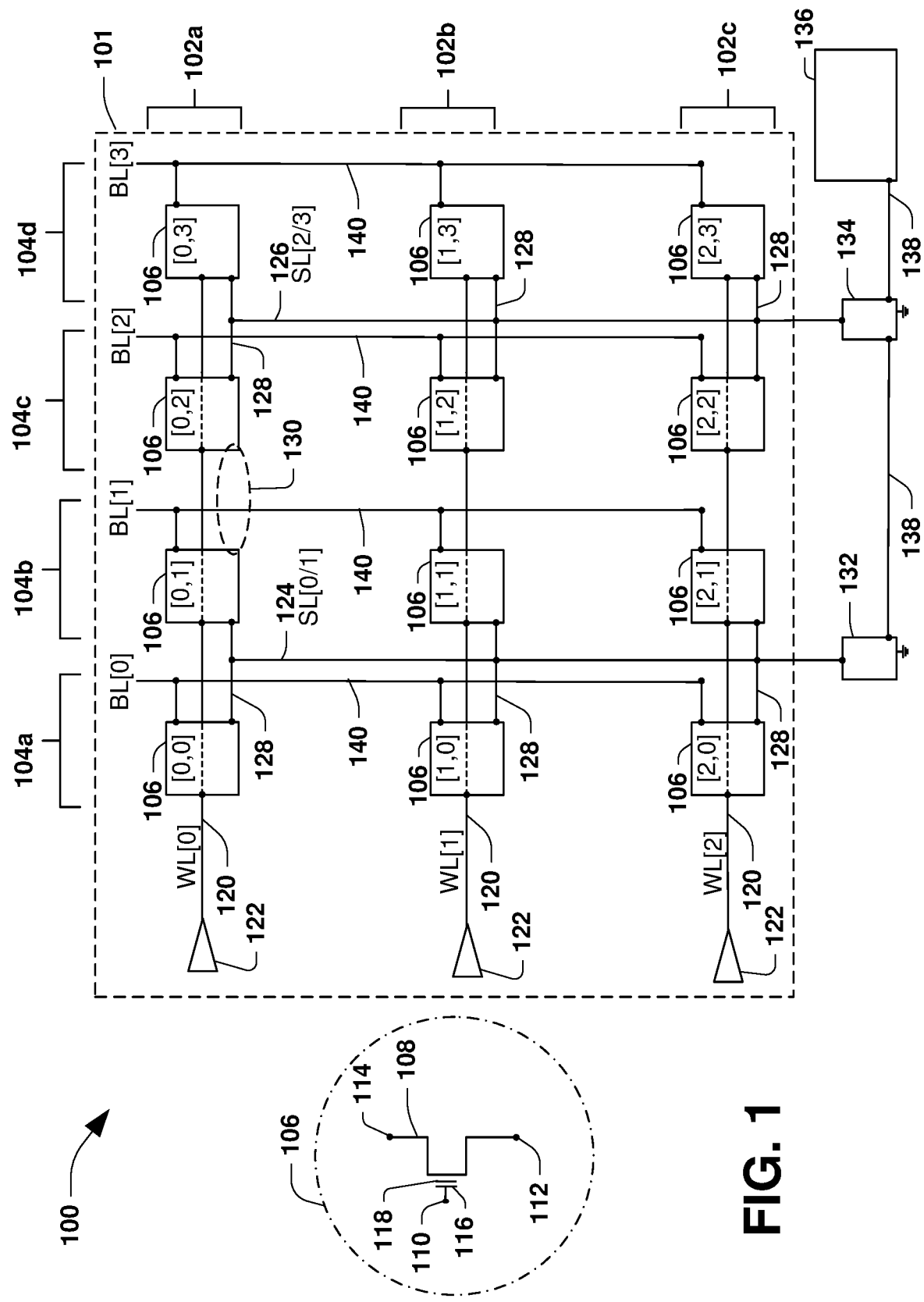
FIG. 1 is a schematic diagram of a memory device, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

Groups of memory cells of a memory array are arranged as respective pages of memory cells. For example, a memory array of 100,000 memory cells may be organized into 10 pages. Each page comprises a plurality of memory cells arranged in rows and columns. The memory device also comprises a plurality source line drivers. Each source line driver is coupled to a subset of the memory cells within a page. For example, a first source line driver may be coupled to the memory cells of a first column and a second column, a second source line driver may be coupled to the memory cells of a third column and a fourth column, etc. When a read operation of a memory cell occurs, current from a selected memory cell is discharged through the source line and the source line driver connected to the memory cell. Because each source line driver is coupled to a subset of memory cells, the source line driver receives the current of only selected memory cells to which the source line driver is connected. Therefore, the size of the source line driver can be controlled as a function of the number of memory cells coupled to the source line driver that can be read simultaneously and the current flowing from each of the memory cells.

By way of a non-limiting example, suppose 1000 bits are simultaneous read from 1000 memory cells in a single page. If the current flowing from each memory cell during the read operation is 40 µA and the source lines for all the memory cells in the page are connected to a same source line driver, the source line driver must be sized to receive a current of 40 mA (40 µA*1000 memory cells) without sustaining damage. If a subset of those 1000 memory cells are connected to a first source line driver and another subset of the 1000 memory cells are connected to a second source line driver as described herein, the total current flowing through each source line driver is less. Therefore, the source line drivers can be reduced to a size that is sufficient to support the current flowing there through, where the size is a function of the number of memory cells coupled to the source line driver that can be read simultaneously and the current flowing from each of the memory cells.

FIG. 1 is a schematic diagram of a memory device 100, according to some embodiments. The memory device 100 comprises a memory array 101, a first source line driver 132, a second source line driver 134, and a latch 136. The memory array 101 comprises memory cells 106 arranged to form memory array rows 102a-102c and memory array columns 104a-104d. The memory array 101 also comprises bit lines (BL[0]-BL[3]) 140, and word lines (WL[0]-WL[2]) 120. In FIG. 1, each memory cell location of a memory cell 106 is indicated by the notation "[row, column]" within memory array 101. According to some embodiments, memory array 101 comprises m×n memory cells, where "m" is the number of rows of memory cells and "n" is the number of columns of memory cells. M and n are each greater than zero.

Each of the memory cells 106 comprises a transistor 108 comprising a word line terminal 110, a first source/drain terminal 112, and a second source/drain terminal 114. According to some embodiments, the transistor 108 also comprises a control gate 116 and a floating gate 118. According to some embodiments, the memory cell 106 is a floating-gate memory cell or other suitable memory cell configuration.

A word line 120 is coupled to the word line terminal 110 of each memory cell 106 within one or more memory array rows 102a-102c. In FIG. 1, a word line 120 is indicated by the notation "WL[r]", where "r" identifies the row number of the word line 120. According to some embodiments, within each row of the memory array rows 102a-102c, a word line driver 122 is coupled to the word line 120. For example, a first word line driver 122 is coupled to a first word line 120 coupled to word line terminals 110 of memory cells 106 with a first memory array row 102a, a second word line driver 122 is coupled to a second word line 120 coupled to word line terminals 110 of memory cells 106 with a second memory array row 102b, etc.

According to some embodiments, memory array 101 comprises a first source line 124 coupled to the first source/drain terminal 112 of at least one memory cell 106 in each of two adjacent columns of memory array columns 104a-104b. The first source/drain terminal 112 may be a source terminal or a drain terminal. In the example embodiment, the first source line 124 is coupled to the first source/drain terminal 112 of each memory cell 106 in a first memory array column 104a and a second memory array column 104b, and the first source line 124 is designated "SL[0/1]" to indicate that the first source line 124 is coupled to the first source/drain terminal 112 of each memory cell 106 in the first ("0") memory array column 104a and in the second ("1") memory array column 104b. According to some embodiments, the first source line 124 is coupled to the first source line driver 132. According to some embodiments, the first source line driver 132 is coupled to the latch 136 by a conductor 138.

According to some embodiments, memory array 101 comprises a second source line 126 coupled to the first source/drain terminal 112 of at least one memory cell 106 in each of two adjacent columns of memory array columns 104c-104d. The first source/drain terminal 112 may be a source terminal or a drain terminal. In the example embodiment, the second source line 126 is coupled to the first source/drain terminal 112 of each memory cell 106 in a third memory array column 104c and a fourth memory array column 104d, and the second source line 126 is designated "SL[2/3]" to indicate that the second source line 126 is coupled to the first source/drain terminal 112 of each memory cell 106 in the third ("2") memory array column 104c and in the fourth ("3") memory array column 104d. According to some embodiments, the second source line 126 is coupled to the second source line driver 134. According to some embodiments, the second source line driver 134 is coupled to the latch 136 by the conductor 138.

According to some embodiments, memory array 101 comprises one or more third source lines 128 in each memory array row 102a-102c. A third source line 128 is coupled to the first source/drain terminal 112 of each memory cell 106 in a memory array row 102a-102c. The third source line 128 is coupled to the first source/drain terminal 112 of a memory cell 106 in a memory array row 102a-102c and to another first source/drain terminal 112 of another memory cell 106 in the same memory array row 102a-102c. According to some embodiments, a third source line 128 is coupled to the first source/drain terminal 112 of merely two memory cells 106 in a memory array row 102a-102c. According to some embodiments, a third source line 128 is coupled to the first source/drain terminal 112 of more than two memory cells 106 in a memory array row 102a-102c. According to some embodiments, memory array 101 comprises more than one third source line 128 in a memory array row 102a-102c. According to some embodiments, the first source/drain terminal 112 of a memory cell 106 in a memory array row 102a-102c is electrically isolated from the first source/drain terminal 112 of an adjacent memory cell 106 in the same memory array row 102a-102c, such that an open circuit region 130 exists between the adjacent memory cells.

The first source line 124 is coupled to two or more third source lines 128 between two memory array columns 104a-104b of memory array columns 104a-104d. According to some embodiments, the second source line 126 is coupled to two or more third source lines 128 between two columns 104c-104d of memory array columns 104a-104d. The first source/drain terminal 112 may be a source terminal or a drain terminal.

According to some embodiments, the bit lines (BL[0]-BL[3]) 140 are coupled to the second source/drain terminal 114 of at least one memory cell 106 in one or more memory array columns 104a-104d. The second source/drain terminal 114 is a source terminal or a drain terminal. According to some embodiments, each bit line of bit lines (BL[0]-BL[3]) 140 is designated "BL[column #]" to indicate the memory array column number of the bit line.

Figure 2:
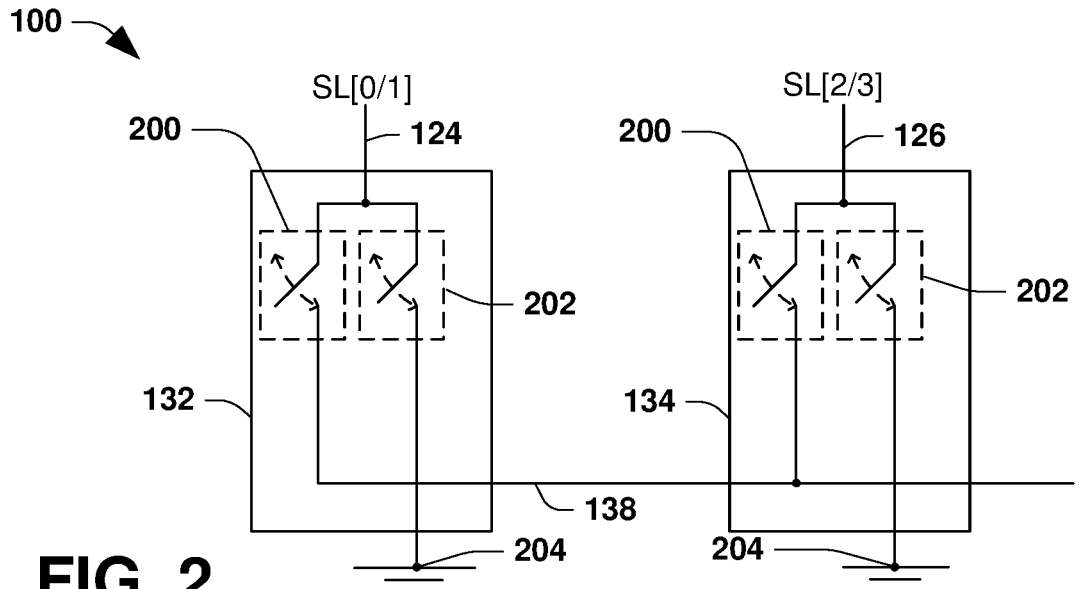
FIG. 2 is a schematic diagram of memory device driving circuits, according to some embodiments.

FIG. 2 is a schematic diagram of the first source line driver 132 and the second source line driver 134 of the memory device 100, according to some embodiments. Each of the first source line driver 132 and the second source line driver 134 comprises a first switch 200 coupled to the first source line 124 or the second source line 126, respectively, and to the conductor 138. Each of the first source line driver 132 and the second source line driver 134 also comprises a second switch 202 coupled to the first source line 124 or the second source line 126, respectively, and to a voltage terminal 204, such as a ground terminal. The first switch 200 and the second switch 202 may be an n-type metal-oxide semiconductor (NMOS) transistor, a p-type metal oxide semiconductor (PMOS) transistor, a complementary metal oxide semiconductor (CMOS) transistor, or other suitable switching element.

According to some embodiments, during a program operation of a memory cell coupled to the first source line 124, the first switch 200 is closed and the second switch 202 is open to couple the latch 136 to the first source line 124. The latch 136 supplies a source line program voltage to the first source line 124 via conductor 138.

According to some embodiments, during a program operation of a memory cell coupled to the second source line 126, the second source line driver 134 functions as explained above with respect to the first source line driver 132 during a program operation.

According to some embodiments, during an erase operation of a memory cell coupled to the first source line 124, the first switch 200 is open and the second switch 202 is closed to couple the voltage terminal 204 to the first source line 124. The voltage level at the voltage terminal 204 is a ground voltage of the memory array 101 or other suitable voltage.

According to some embodiments, during an erase operation of a memory cell coupled to the second source line 126, the second source line driver 134 functions as explained above with respect to the first source line driver 132 during an erase operation.

According to some embodiments, during a read operation of a memory cell coupled to the first source line 124, the first switch 200 is open and the second switch 202 is closed to couple the voltage terminal 204 to the first source line 124, and cell current of a memory cell to be read and current of the first source line 124 are discharged through the first source line driver 132. Because the first source line 124 and the first source line driver 132 are not coupled to memory cells not comprised in the first memory array column 104a or the second memory array column 104b, current advantageously discharges at an improved (quicker) rate compared to the discharge rate through a source line and source line driver coupled to additional memory cells not within the first memory array column 104a or the second memory array column 104b. Moreover, the improved discharge rate improves the read margin of a memory cell.

According to some embodiments, during a read operation of a memory cell coupled to the second source line 126, the second source line driver 134 functions as explained above with respect to the first source line driver 132 during the read operation.

Figure 3:
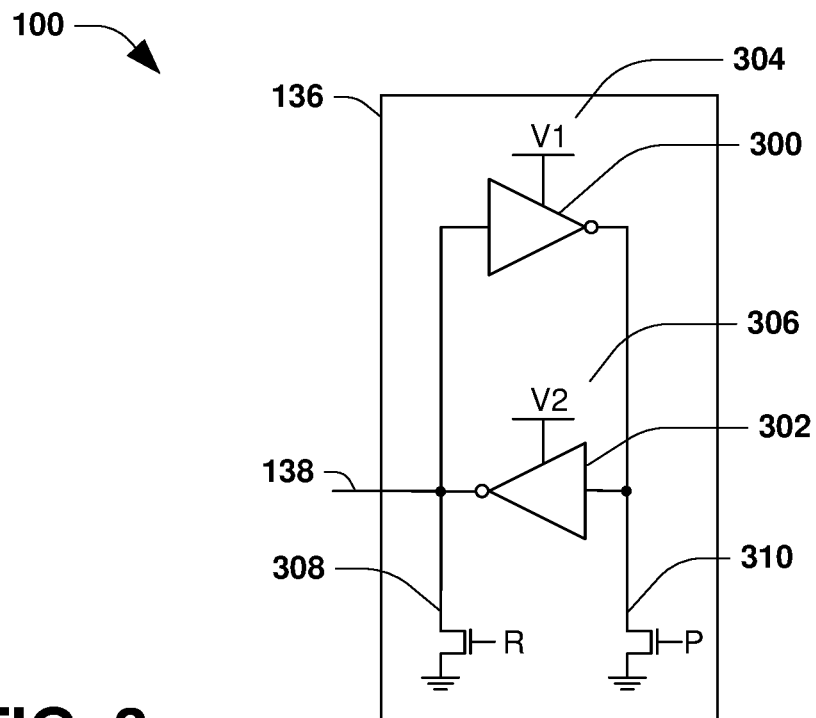
FIG. 3 is a schematic diagram of a latch of a memory device, according to some embodiments.

FIG. 3 is a schematic diagram of the latch 136 of the memory device 100, according to some embodiments. In some embodiments, the latch 136 supplies a source line program voltage to the first source line driver 132 and the second source line driver 134 via the conductor 138.

According to some embodiments, the latch 136 comprises a first inverter 300 coupled to a second inverter 302 in a loop configuration. The first inverter 300 is coupled to a first power source 304 that supplies a first supply voltage V1, and the second inverter 302 is coupled to a second power source 306 that supplies a second supply voltage V2. The voltage level of the first supply voltage V1 may be the same as or different than the voltage level of the second supply voltage V2. According to some embodiments, the latch 136 also comprises a reset switch 308 and a program switch 310. In a program operation of the memory device 100, the program switch 310 is closed and the reset switch 308 is open, and the second inverter 302 outputs the second supply voltage V2 to conductor 138. In an erase or read operation of the memory device 100, the program switch 310 is open and the reset switch 308 is closed, and the latch 136 outputs a specified voltage of the memory array 101, such as ground or other suitable voltage, to conductor 138.

Referring back to FIG. 1, in a program operation of a memory cell 106, such as memory cell [0,0], the word line driver 122 supplies a first voltage to the word line terminal 110 of the memory cell 106 being programmed, the first source line driver 132 supplies a second voltage to the first source/drain terminal 112 of the memory cell 106 being programmed, and a bit line driver (not shown) supplies a third voltage to the second source/drain terminal 114 of the memory cell 106 being programmed. According to some embodiments, the first voltage is greater than the second voltage, and the second voltage is greater than the third voltage. For example, the high voltage may be 11 volts, the medium voltage may be 4.3 volts, and the low voltage may be 0.2 volts.

According to some embodiments, in an erase operation of a memory cell 106, such as memory cell [0,0], the word line driver 122 supplies a first voltage to the word line terminal 110 of the memory cell 106 being erased, the first source line driver 132 supplies a second voltage to the first source/drain terminal 112 of the memory cell 106 being erased, and a bit line driver (not shown) supplies the second voltage to the second source/drain terminal 114 of the memory cell 106 being erased. According to some embodiments, the first voltage is greater than the second voltage. For example, the first voltage may be 13 volts and the second voltage may be 0 volts.

According to some embodiments, in a read operation of a memory cell 106, such as memory cell [0,0], the word line driver 122 supplies a threshold voltage of the word line terminal 110 of the memory cell 106 being read, the first source line driver 132 supplies a first voltage to the first source/drain terminal 112 of the memory cell 106 being read, and a bit line driver (not shown) supplies a read voltage to the second source/drain terminal 114 of the memory cell 106 being read. According to some embodiments, the threshold voltage is greater than the first voltage and the read voltage, and the read voltage is greater than the first voltage. For example, the threshold voltage may be 5 volts, the low voltage may be 0 volts, and the read voltage may be 0.6 volt.

Figures 4A, 4B:
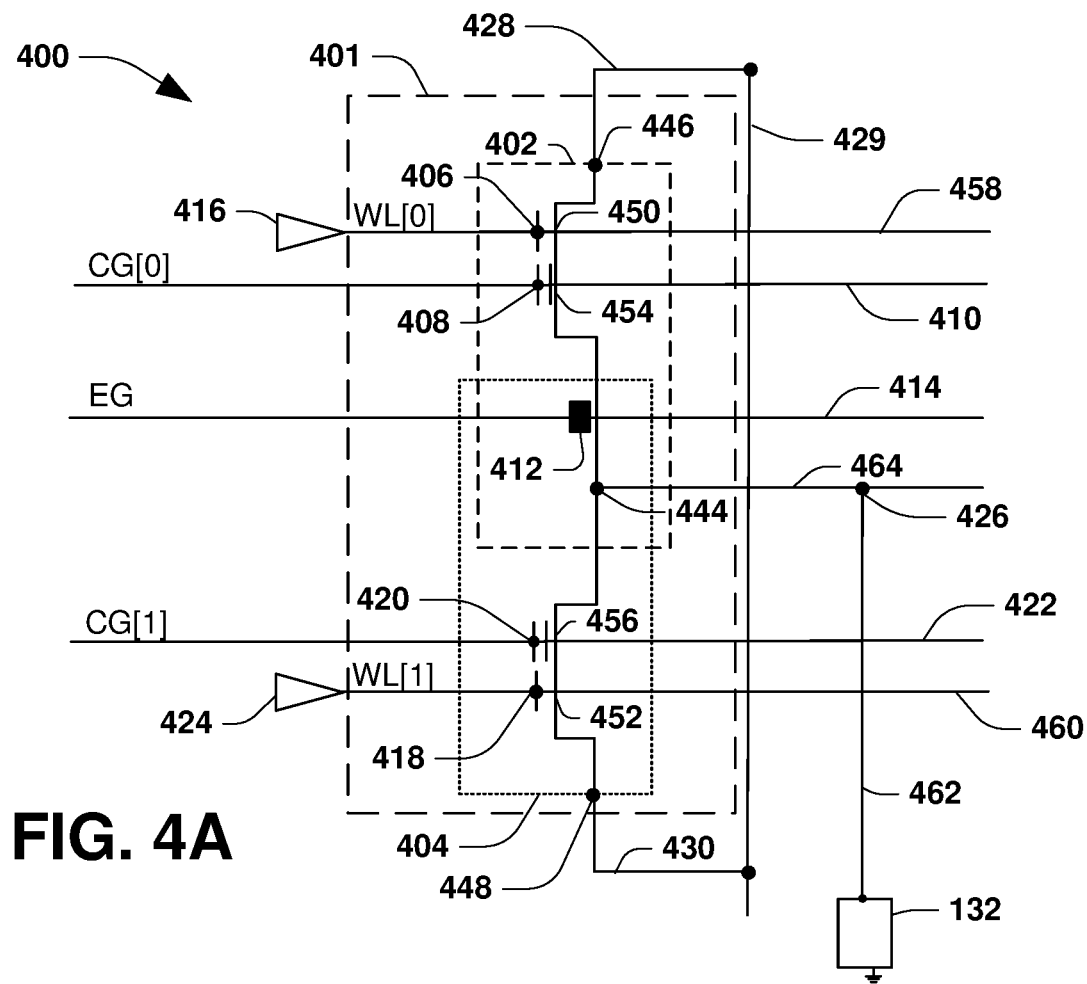
FIG. 4A is a schematic diagram of a memory device, according to some embodiments.
FIG. 4B illustrates cross-sectional view of a memory device, according to some embodiments.

FIG. 4A is a schematic diagram of a memory device 400, according to some embodiments. The memory device 400 comprises a supercell 401, a first word line driver 416 coupled to a first word line 458 (WL[0]), a second word line driver 424 coupled to a second word line 460 (WL[1]), a bit line 429 coupled to a first memory cell bit line 428 and a second memory cell bit line 430, an erase gate line 414, a first control gate line 410 (CG[0]), a second control gate line 422 (CG[1]), a source line 462 coupled to a common source line 464 at a source line junction 426, and the first source line driver 132. According to some embodiments, the supercell 401 comprises a first memory cell 402 and a second memory cell 404. According to some embodiments, the first memory cell 402 and the second memory cell 404 are multi-gate transistors, such as floating-gate transistors.

According to some embodiments, the memory device 400 comprises a first word line terminal 406 of the supercell 401 and a first control gate terminal 408 of the supercell 401. The first word line terminal 406 of the supercell 401 is coupled to a first select gate 450 and the first word line 458. The first control gate terminal 408 is coupled to a first control gate 454 and the first control gate line 410.

According to some embodiments, the memory device 400 comprises a second word line terminal 418 and a second control gate terminal 420. The second word line terminal 418 is coupled to a second select gate 452 and the second word line 460. The second control gate terminal 420 is coupled to a second control gate 456 and the second control gate line 422.

According to some embodiments, the first memory cell 402 and the second memory cell 404 share an erase gate 412 coupled to the erase gate line 414.

According to some embodiments, the supercell 401 comprises a common source/drain terminal 444 common to the first memory cell 402 and the second memory cell 404. The common source/drain terminal 444 is coupled to the common source line 464.

According to some embodiments, the first memory cell 402 comprises a first source/drain terminal 446 coupled to the first memory cell bit line 428, and the second memory cell 404 comprises a second source/drain terminal 448 coupled to the second memory cell bit line 430.

Referring to FIG. 4B, according to some embodiments the supercell 401 comprises a first floating gate 432 over a first insulator layer 466 and a second floating gate 434 over a second insulator layer 468. The first insulator layer 466 and the second insulator layer 468 are over channel regions of the supercell 401. A first floating gate insulator layer 470 is over the first floating gate 432 and a second floating gate insulator layer 436 is over the second floating gate 434. A common source/drain region 442 is between the first floating gate insulator layer 470 and the second floating gate insulator layer 436 and is coupled to the common source/drain terminal 444. A first drain/source region 438 is under the first insulator layer 466 and is coupled to the first source/drain terminal 446, and a second source/drain region 440 is under the second insulator layer 468 and coupled to the second source/drain terminal 448.

Figure 5:
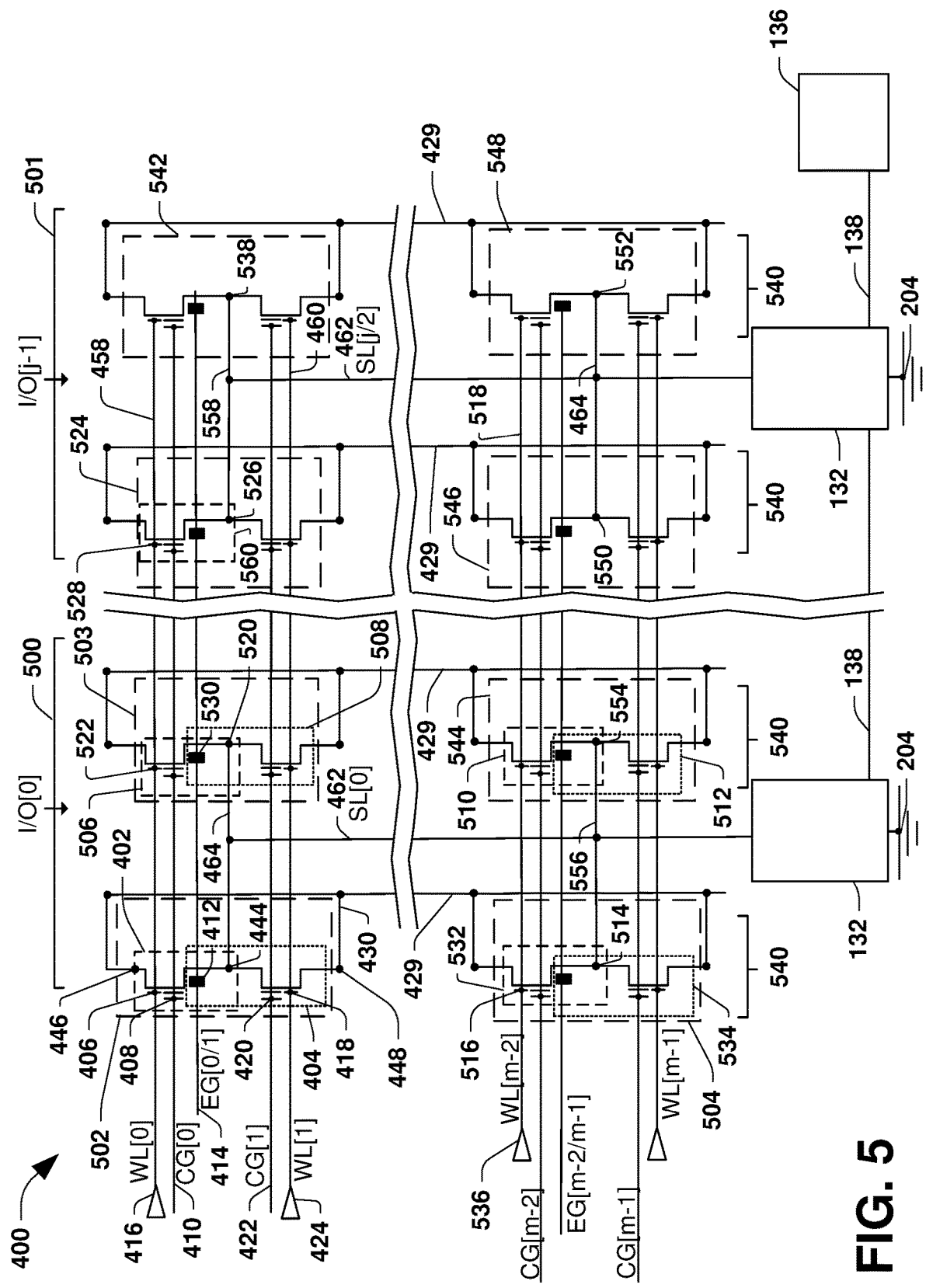
FIG. 5 is a schematic diagram of a memory device, according to some embodiments.

Referring to FIG. 5, in some embodiments the memory device 400 comprises "j" Input/Output (I/O) columns, where "j" is a positive integer. In some embodiments, the memory device 400 comprises column I/O[0] 500 through column I/O[j−1] 501, each comprising a plurality of supercells 540. A column of the one or more columns of supercells 540 comprises "m/2−1" supercells, where "m" is a positive even integer greater than 3.

According to some embodiments, the memory device 400 comprises a first supercell 502, a second supercell 503, a third supercell 504, a fourth supercell 524, a fifth supercell 542, a sixth supercell 544, a seventh supercell 546, and an eighth supercell 548. Referring to column I/O[0] 500, the first supercell 502 comprises the first memory cell 402 and the second memory cell 404, the second supercell 503 comprises a third memory cell 506 and a fourth memory cell 508, the third supercell 504 comprises a fifth memory cell 532 and a sixth memory cell 534, and the sixth supercell 544 comprises a seventh memory cell 510 and an eighth memory cell 512. In some embodiments, the supercells of column I/O[j−1] 501 are structurally similar to the supercells of column I/O[0] 500. Thus, a detailed explanation of column I/O[j−1] 501 is omitted herein to forgo repetition of disclosure.

According to some embodiments, the first supercell 502, the second supercell 503, the third supercell 504, the fourth supercell 524, the fifth supercell 542, the sixth supercell 544, the seventh supercell 546, and the eighth supercell 548 are structurally similar to supercell 401 of FIG. 4. Thus, a detailed explanation of the supercells of FIG. 5 are omitted herein to forgo repetition of disclosure.

According to some embodiments, the first word line 458 is electrically coupled to the first word line terminal 406, a word line terminal 522 of the second supercell 503, and a word line terminal 528 of the fourth supercell 524. According to some embodiments, the erase gate line 414 is electrically coupled to the erase gate 412 of the first supercell 502 and an erase gate 530 of the second supercell 503. A third word line 518 is electrically coupled to a word line terminal 516 of the third supercell 504.

According to some embodiments, the memory device 400 comprises a source line 462 electrically coupled to the common source/drain terminal 444 of the first supercell 502, a common source/drain terminal 520 of the second supercell 503, a common source/drain terminal 514 of the third supercell 504, and a common source/drain terminal 554 of the sixth supercell 544. The common source line 464 is electrically coupled to the source line 462, the common source/drain terminal 444 of the first supercell 502, and the common source/drain terminal 520 of the second supercell 503. A common source line 556 is electrically coupled to the source line 462, the common source/drain terminal 514 of the third supercell 504, and the common source/drain terminal 554 of the sixth supercell 544.

According to some embodiments, the source line 462 of column I/O[j−1] 501 is electrically coupled to a common source/drain terminal 526 of the fourth supercell 524, a common source/drain terminal 538 of the fifth supercell 542, a common source/drain terminal 550 of the seventh supercell 546, and a common source/drain terminal 552 of the eighth supercell 548. A first common source line 558 of column I/O[j−1] 501 is electrically coupled to source line 462 (SL[j/2]), a common source/drain terminal 526 of the fourth supercell 524, and the common source/drain terminal 520 of the second supercell 503. A second common source line 560 of column I/O[j−1] is electrically coupled to the source line 462 (SL[j/2]), a common source/drain terminal 550 of the seventh supercell 546, and the common source/drain terminal 552 of the eighth supercell 548.

According to some embodiments, the common source/drain terminal 520 of the second supercell 503 is electrically coupled (coupling conductor not illustrated) to the common source/drain terminal 526 of the fourth supercell 524. According to some other embodiments, the common source/drain terminal 520 of the second supercell 503 is electrically isolated from the common source/drain terminal 526 of the fourth supercell 524.

According to some embodiments, the first source line driver 132 is configured to electrically couple the source line 462 to the voltage terminal 204. The first source line driver 132 is configured to electrically couple the source line 462 to the latch 136. In some embodiments in which the common source/drain terminal 520 of the second supercell 503 is electrically isolated from the common source/drain terminal 526 of the fourth supercell 524, during a program operation of a memory cell in column I/O[0] 500, the source line 462 (SL[j/2]) is coupled to the voltage terminal 204. In some embodiments in which the common source/drain terminal 520 of the second supercell 503 is electrically isolated from the common source/drain terminal 526 of the fourth supercell 524, during a program operation of a memory cell in column I/O[0] 500, the source line 462 (SL[j/2]) is coupled to conductor 138. In some embodiments in which the common source/drain terminal 520 of the second supercell 503 is electrically coupled to the common source/drain terminal 526 of the fourth supercell 524, during a program operation of a memory cell in column I/O[0] 500, the source line 462 (SL[j/2]) is coupled to conductor 138.

Figure 6:
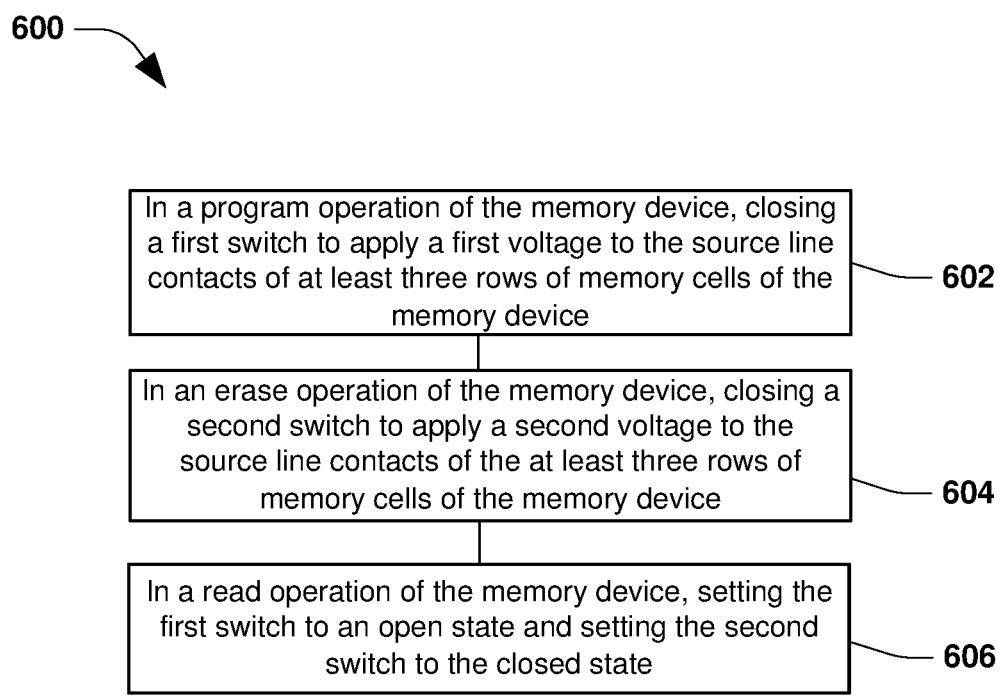
FIG. 6 illustrates a method of operating a memory device, according to some embodiments.

Referring to FIG. 6, a method 600 of operating a memory device 400 comprises a program operation 602, an erase operation 604, and a read operation 606, according to some embodiments. In the program operation 602 a first switch is closed to apply a program voltage to source line contacts of at least three rows of memory cells of the memory device. In the erase operation 604 of the memory device a second switch is closed to apply an erase voltage to the source terminals of the at least three rows of memory cells of the memory device. In the read operation 606 of the memory device, the first switch is open and the second switch is closed. According to some embodiments, the first switch is the first switch 200 of FIG. 2, the second switch is the second switch 202 of FIG. 2, the program voltage is V2 of FIG. 3, the erase voltage is 0 volts, and memory cells of the at least three rows of memory cells comprise the first memory cell 402, the second memory cell 404, and the fifth memory cell 532 of FIG. 5.

Figure 7:
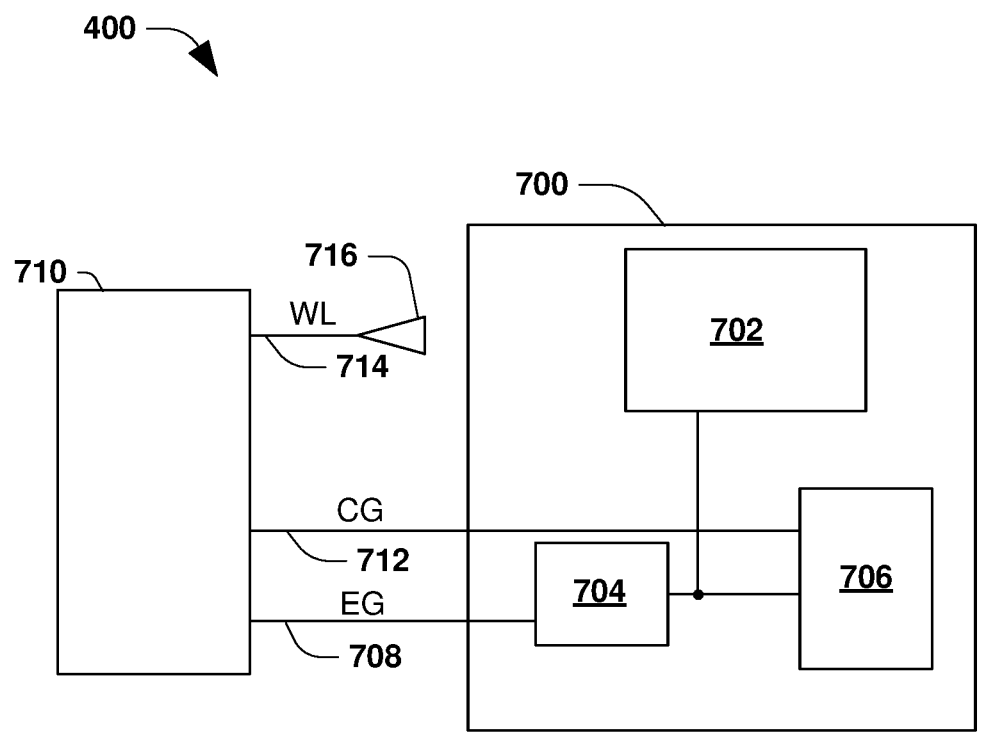
FIG. 7 illustrates a memory device and a memory device control circuit, according to some embodiments.

FIG. 7 illustrates a memory device 400 comprising a memory device control circuit 700, according to some embodiments. In some embodiments, the memory device control circuit 700 comprises a voltage latch and buffer circuit 702, an erase gate driver 704, and a control gate driver 706. The voltage latch and buffer circuit 702 is coupled to the erase gate driver 704 and the control gate driver 706. The erase gate driver 704 is coupled to an erase gate line 708 of a row of memory cells 710 of the memory device 400. The control gate driver 706 is coupled to a control gate line 712 of the row of memory cells 710. A word line driver 716 is coupled to a word line 714 of the row of memory cells.

Figure 8:
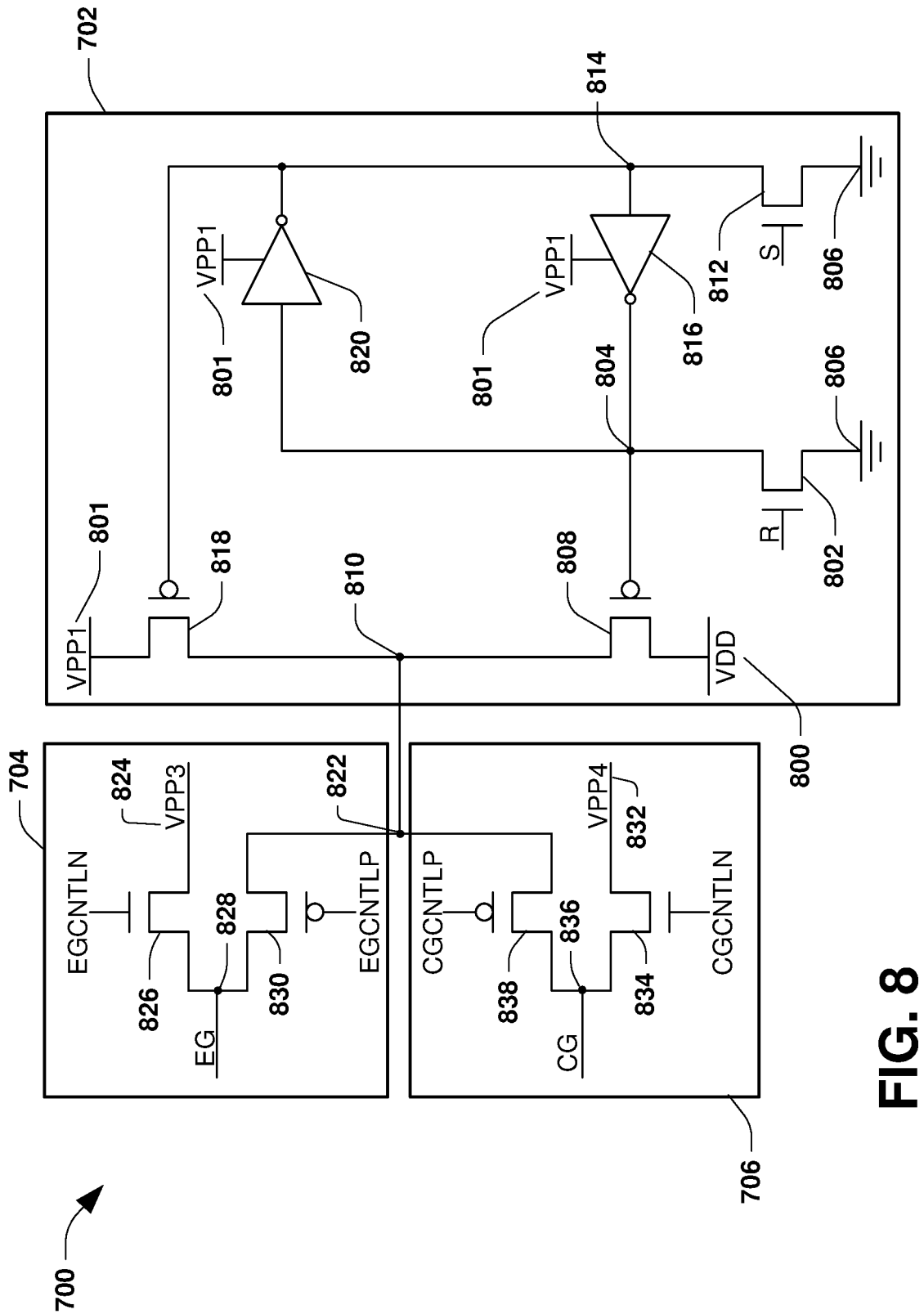
FIG. 8 is a schematic diagram of a memory device control circuit, according to some embodiments.

FIG. 8 is a schematic diagram of the memory device control circuit 700, according to some embodiments. According to some embodiments, the voltage latch and buffer circuit 702 of the memory device control circuit 700 comprises a first voltage source VDD 800 and a second voltage source VPP1 801. The voltage latch and buffer circuit 702 comprises a reset switch 802 coupled to a first node 804. In a closed state, the reset switch 802 couples the first node 804 to a voltage terminal 806, setting the voltage at the first node 804 low, according to some embodiments. In some embodiments, a low voltage corresponds to ground potential. When the voltage at the first node 804 is low, a first switch 808 closes, thereby setting the voltage at an output node 810 of the voltage latch and buffer circuit 702 to VDD.

According to some embodiments, the voltage latch and buffer circuit 702 comprises a set switch 812 coupled to a second node 814. In a closed state, the set switch 812 couples the second node 814 to a voltage terminal 806, setting the voltage at the second node 814 low, according to some embodiments. When the voltage at the second node 814 is low, a first inverter 816 sets the voltage at the first node 804 to VPP1, thereby opening the first switch 808. In some embodiments, when the voltage at the second node 814 is low, a second switch 818 is closed. When the second switch 818 is closed, the voltage at the output node 810 is VPP1. According to some embodiments, the voltage latch and buffer circuit 702 comprises a second inverter 820 having its output coupled to the input of the first inverter 816. The first inverter 816 and the second inverter 820 comprise an inverter loop.

According to some embodiments, the reset switch 802 receives a reset signal "R" and the set switch 812 receives a set signal "S". When "R" is high and "S" is low, the voltage at the output node 810 is VDD. In some embodiments, when "R" is low and "S" is high, the voltage at the output node 810 is VPP1.

According to some embodiments, the erase gate driver 704 comprises an input node 822 coupled to the output node 810 of the voltage latch and buffer circuit 702. The erase gate driver 704 comprises a third voltage source VPP3 824 coupled to a first erase gate switch 826. The first erase gate switch 826 is one of an n-channel metal oxide semiconductor field effect transistor (MOSFET), a p-channel MOSFET, or other suitable switching element. According to some embodiments, the first erase gate switch 826 and a second erase gate switch 830 are coupled to an output node 828 of the erase gate driver 704. The second erase gate switch 830 is one of an n-channel MOSFET, a p-channel MOSFET, or other suitable switching element. According to some embodiments, if the first erase gate switch 826 is an n-channel MOSFET, then the second erase gate switch 830 is a p-channel MOSFET. If the first erase gate switch 826 is a p-channel MOSFET, then the second erase gate switch 830 is an n-channel MOSFET. When the gate terminals of the first erase gate switch 826 and the second erase gate switch 830 receive a high voltage (when EGCNTLN and EGCNTLP are high signals), the first erase gate switch 826 is closed and the second erase gate switch 830 is open. When the first erase gate switch 826 is closed and the second erase gate switch 830 is open, the output node 828 of the erase gate driver 704 is at VPP3. When the gate terminals of the first erase gate switch 826 and the second erase gate switch 830 receive a low voltage (when EGCNTLN and EGCNTLP are low signals), the first erase gate switch 826 is open and the second erase gate switch 830 is closed. When the first erase gate switch 826 is open and the second erase gate switch 830 is closed, the voltage at the output node 828 of the erase gate driver 704 is the voltage at the input node 822 of the erase gate driver 704.

According to some embodiments, the control gate driver 706 comprises an input node 822 coupled to the output node 810 of the voltage latch and buffer circuit 702. The control gate driver 706 comprises a fourth voltage source VPP4 832 coupled to a first control gate switch 834. The first control gate switch 834 is one of an n-channel MOSFET, a p-channel MOSFET, or other suitable switching element. The first control gate switch 834 and a second control gate switch 838 are coupled to an output node 836 of the control gate driver 706. The second control gate switch 838 is one of an n-channel MOSFET, a p-channel MOSFET, or other suitable switching element. According to some embodiments, if the first control gate switch 834 is an n-channel MOSFET, then the second control gate switch 838 is a p-channel MOSFET. If the first control gate switch 834 is a p-channel MOSFET, then the second control gate switch 838 is an n-channel MOSFET. According to some embodiments, when the gate terminals of the first control gate switch 834 and the second control gate switch 838 receive a high voltage signal (when CGCNTLN and CGCNTLP are high signals), the first control gate switch 834 is closed and the second control gate switch 838 is open. When the first control gate switch 834 is closed and the second control gate switch 838 is open, the output node 836 of the control gate driver 706 is VPP4. When the gate terminals of the first control gate switch 834 and the second control gate switch 838 receive a low voltage (when CGCNTLN and CGCNTLP are low signals), the first control gate switch 834 is open and the second control gate switch 838 is closed. When the first control gate switch 834 is open and the second control gate switch 838 is closed, the voltage at the output node 836 of the control gate driver 706 is the voltage at the input node 822 of the control gate driver 706.

Figure 9:
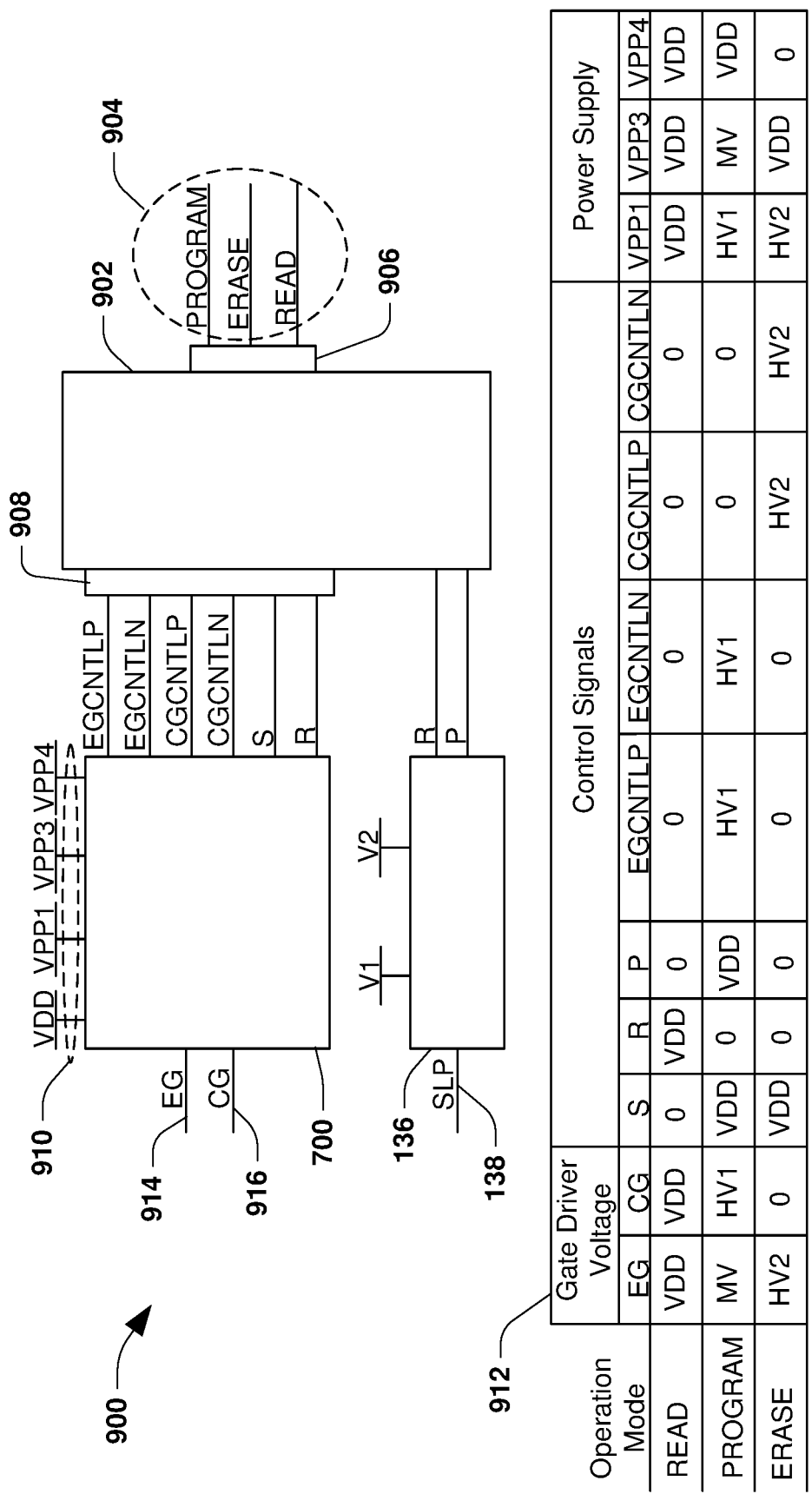
FIG. 9 illustrates a memory device control system and signal levels for performing memory device operations, according to some embodiments.

FIG. 9 illustrates a memory device control system 900 and signal and power supply levels for performing memory device operations, according to some embodiments. The memory device control system 900 comprises a controller 902. The controller 902 is one or more of a processor, a control signal circuit block, or other suitable control signal generator and an input terminal 906 configured to receive memory device commands 904. According to some embodiments, the memory device commands are one or more of program, erase, read, or other suitable commands. According to some embodiments, the controller 902 also comprises an output terminal 908 configured to output at least one of control signals or other suitable signals or voltages. The control signals are received by the memory device control circuit 700 and the latch 136. The memory device control circuit 700 comprises power supply terminals 910 that supply voltages to components of the memory device control circuit 700. The memory device control circuit 700 comprises one or more of an erase gate output terminal 914, a control gate output terminal 916, or other suitable output terminals. According to some embodiments, the latch 136 outputs a source line program voltage (SLP) at conductor 138.

Table 912 illustrates memory device control system 900 operation modes, according to some embodiments. The operation modes correspond to the memory device commands 904 or other suitable signals. Table 912 shows memory device control system 900 control signal levels for each operation mode, power supply voltage levels, and erase gate and control gate signal levels for each operation mode. According to some embodiments, $$HV2 \geq HV1 \geq MV \geq VDD > 0$$

For example, HV2 may equal 13V, HV1 may equal 11V, MV may equal 4.3V, and 1.8V<VDD<2.3V.

According to some embodiments, during a program operation of a selected memory cell, the bit line coupled to the selected memory cell is pre-charged to a bit line programming voltage (VPBL). For example, VPBL may be 0.2V. Also during the program operation of the selected memory cell, a bit line coupled to one or more unselected memory cells is charged to an unselected bit line voltage. For example, the unselected bit line voltage may be 1.3V.

Figure 10:
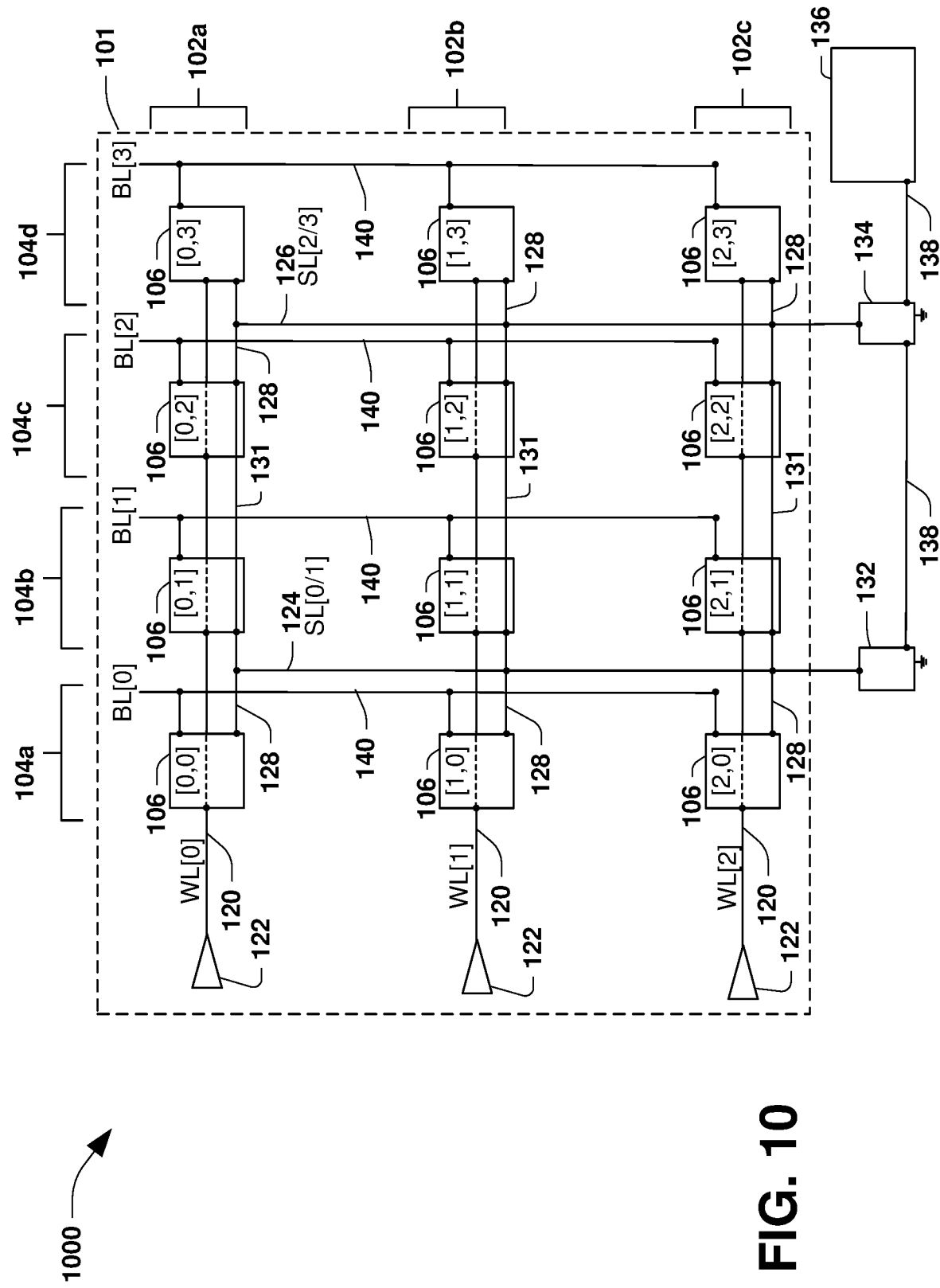
FIG. 10 is a schematic diagram of a memory device, according to some embodiments.

FIG. 10 is a schematic diagram of a memory device 1000, according to some embodiments. The memory device 1000 is similar to the memory device 100 of FIG. 1, with the addition of a fourth source line 131 in each memory array row 102a-102c. The fourth source line 131 is coupled to adjacent third source lines 128 in each memory array row 102a-102c. Because the fourth source line 131 establishes a continuous conductive path through the source terminals of each memory cell 106 in a memory array row 102a-102c, current may discharge through more than one conductive path to the first source line driver 132 and the second source line driver 134. For example, a first portion of source current from memory cell [0,1] may discharge through the third source line 128, to the first source line 124 (SL[0/1]), and to the first source line driver 132, and a second portion of the source current from memory cell [0,1] may discharge through the fourth source line 131, to the third source line 128, to the second source line 126 (SL[2/3]), and to the second source line driver 134.

According to some embodiments, in preparation for a read operation of a memory cell of a page of memory cells, cell current is discharged from the source terminal of the memory cell to be read, through a source line coupled to at least three memory cells, and to a source line driver. Because the source line driver receives current from only the memory cell to be read, the need for an M-times larger source line driver in the page direction is obviated, where M is the number of cells of the page. Also, because cell current from only the memory cell to be read is discharged to the source line driver, the read margin of the memory cell is improved and current drop along the source line is reduced as compared the read margin and current drop of the configuration in which cell current from each memory cell of a page is discharged to a source line driver in the page direction.

According to some embodiments, a memory device includes a first memory cell, a second memory cell, and a third memory cell. According to some embodiments, the first memory cell includes a first source terminal and a first word line terminal, the second memory cell includes a second source terminal and a second word line terminal, and the a third memory cell includes a third source terminal and a third word line terminal. According to some embodiments, the memory cell includes a first word line driver, a first word line coupled to first word line driver and the first word line terminal, a second word line driver, a second word line coupled to the second word line driver and the second word line terminal, a third word line driver, a third word line coupled to the third word line driver and the third word line terminal, a first source line driver, and a source line coupled to the first source terminal, the second source terminal, the third source terminal, and the first source line driver.

According to some embodiments, the first source terminal and the second source terminal are a same source terminal.

According to some embodiments, the memory device comprises a fourth memory cell comprising a fourth source terminal and a fourth word line terminal, and a fifth memory cell comprises a fifth source terminal and a fifth word line terminal. According to some embodiments, the first source terminal is electrically coupled to the fourth source terminal, the fifth source terminal is electrically isolated from the fourth source terminal, and the fifth word line terminal is electrically coupled to the fourth word line terminal.

According to some embodiments, the memory device comprises a second source line driver electrically coupled to the fifth source terminal.

According to some embodiments, the memory device comprises a latch electrically coupled to the first source line driver and the second source line driver.

According to some embodiments, the first memory cell and the second memory cell comprise a supercell.

According to some embodiments, the memory device comprises a voltage latch and buffer circuit, an erase gate driver coupled to the voltage latch and buffer circuit, the first memory cell, and the second memory cell, and a control gate driver coupled to the voltage latch and buffer circuit, and the first memory cell.

According to some embodiments, the first memory cell comprises a first control gate terminal and a first erase gate, and the second memory cell comprises a second control gate terminal and a second erase gate.

According to some embodiments, the first erase gate and the second erase gate are a same erase gate.

According to some embodiments, a memory device includes a first supercell, a second supercell spaced apart from the first supercell in a first direction, a third supercell spaced apart from the first supercell in a second direction different than the first direction, and a first source line coupled to the first supercell, the second supercell, and the third supercell.

According to some embodiments, the first supercell comprises a first memory cell and a second memory cell, the first memory cell and the second memory cell share a common source/drain region, and the source line is coupled to the common source/drain region.

According to some embodiments, the second direction is perpendicular to the first direction.

According to some embodiments, the memory device comprises a latch and a first source line driver electrically coupled to the first source line. According to some embodiments, the first source line driver comprises a first switch electrically coupled to the first source line and the latch, and a second switch electrically coupled to the first source line and a voltage terminal.

According to some embodiments, the memory device comprises a fourth supercell spaced apart from the first supercell in the first direction, a second source line electrically coupled to the fourth supercell, and a second source line driver electrically coupled to the latch and the second source line.

According to some embodiments, the memory device comprises a first bit line electrically coupled to a first memory cell of the first supercell, a second memory cell of the first supercell, and the third supercell, and a second bit line electrically coupled to the second supercell.

According to some embodiments, the memory device comprises a first memory cell of the first supercell, a second memory cell of the first supercell, and an erase gate shared by the first memory cell and the second memory cell.

According to some embodiments, the memory device comprises a first erase gate of the first supercell, and a second erase gate of the second supercell and electrically coupled to the first erase gate.

According to some embodiments, a method of operating a memory device includes, in a program operation of the memory device, closing a first switch to apply a first voltage to source line contacts of at least three rows of memory cells of the memory device, and in an erase operation of the memory device, closing a second switch to apply a second voltage to the source line contacts of the at least three rows of memory cells of the memory device.

According to some embodiments, in a read operation of the memory device, the method comprises setting the first switch to an open state and setting the second switch to a closed state.

According to some embodiments, the erase operation comprises discharging current through the second switch to a specified voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A memory device, comprising:
  a latch comprising a reset switch;
  a memory cell;
  a word line driver configured to:
    during a read operation of the memory cell, supply a threshold voltage to a word line terminal of the memory cell, and
    during a program operation of the memory cell, supply a first voltage to the word line terminal of the memory cell;
  a source line driver comprising a first switch and a second switch and configured to:
    during the read operation of the memory cell, close the first switch to supply a second voltage to a first source/drain terminal of the memory cell, wherein the threshold voltage is greater than the second voltage, and
    during the program operation of the memory cell, close the second switch and open the first switch to couple the first source/drain terminal of the memory cell to the latch to apply a third voltage at the latch to the first source/drain terminal of the memory cell, wherein closing the second switch couples a first terminal of the reset switch to the first source/drain terminal of the memory cell and the first voltage is greater than the third voltage; and a bit line driver configured to:
during the read operation of the memory cell, supply a read voltage to a second source/drain terminal of the memory cell, wherein the read voltage is greater than the second voltage, and
during the program operation of the memory cell, supply a fourth voltage to the second source/drain terminal of the memory cell, wherein the third voltage is greater than the fourth voltage.

2. The memory device of claim 1, comprising:
a first column of memory cells; and
a second column of memory cells, wherein:
the first column of memory cells comprises the memory cell,
during the program operation of the memory cell, the source line driver is configured to close the second switch to apply the third voltage to source line contacts of at least the first column of memory cells and the second column of memory cells, and
during an erase operation of the memory cell, the source line driver is configured to close the first switch to apply a fifth voltage to the source line contacts of at least the first column of memory cells and the second column of memory cells.

3. The memory device of claim 2, wherein the erase operation comprises discharging current through the first switch to a specified voltage.

4. The memory device of claim 1, wherein the latch comprises:
a first inverter;
a second inverter coupled in parallel to the first inverter;
the reset switch coupled to a first terminal of the first inverter and a first terminal of the second inverter; and
a program switch coupled to a second terminal of the first inverter and a second terminal of the second inverter.

5. The memory device of claim 4, comprising a memory device control circuit configured to:
during the program operation of the memory cell, close the program switch and open the reset switch; and
during an erase operation of the memory cell, open the program switch and close the reset switch.

6. The memory device of claim 4, wherein the second switch is coupled to a common node of the reset switch, the first terminal of the first inverter, and the first terminal of the second inverter.

7. The memory device of claim 1, wherein the source line driver is configured to:
during the read operation of the memory cell, open the second switch.

8. The memory device of claim 1, wherein:
the memory cell is disposed in a first row of memory cells, and
the memory device comprises a second word line driver coupled to a second memory cell in a second row of the memory cells, the second word line driver different than the word line driver.

9. The memory device of claim 1, comprising:
a second source line driver comprising a third switch and a fourth switch different than the first switch and the second switch.

10. The memory device of claim 9, wherein:
the source line driver is coupled to at least one memory cell in each of at least three rows of memory cells,
the second source line driver is coupled to at least one memory cell in each of the at least three rows of memory cells, and
the at least one memory cell in each of the at least three rows of memory cells to which the source line driver is coupled is different than the at least one memory cell in each of the at least three rows of memory cells to which the second source line driver is coupled.

11. The memory device of claim 1, wherein during the program operation of the memory cell, the source line driver is configured to close the second switch to apply the third voltage to source line contacts of at least two columns of memory cells of the memory device, at least one of the at least two columns of memory cells comprising the memory cell.

12. The memory device of claim 1, wherein during an erase operation of the memory cell, the source line driver is configured to close the first switch to apply a fifth voltage to source line contacts of at least two columns of memory cells of the memory device, at least one of the at least two columns of memory cells comprising the memory cell.

13. The memory device of claim 1, wherein the latch comprises:
an inverter coupled to a power source that supplies the third voltage.

14. A method of operating a memory device, the method comprising:
during a read operation of a memory cell:
supplying a threshold voltage to a word line terminal of the memory cell;
closing a first switch of a source line driver to supply a first voltage to a first source/drain terminal of the memory cell; and
supplying a read voltage to a second source/drain terminal of the memory cell, wherein:
the threshold voltage is greater than the first voltage; and
the read voltage is greater than the first voltage; and
during a program operation of the memory cell:
supplying a second voltage to the word line terminal of the memory cell;
closing a second switch of the source line driver and opening the first switch to couple the first source/drain terminal of the memory cell to a latch to apply a third voltage at the latch to the first source/drain terminal of the memory cell, wherein closing the second switch of the source line driver couples a first terminal of a first inverter of the latch to the first source/drain terminal of the memory cell and closing the second switch of the source line driver couples a first terminal of a reset switch of the latch to the first source/drain terminal of the memory cell; and
supplying a fourth voltage to the second source/drain terminal of the memory cell, wherein:
the second voltage is greater than the third voltage, and
the third voltage is greater than the fourth voltage.

15. The method of claim 14, comprising:
during an erase operation of the memory cell:
supplying a fifth voltage to the word line terminal of the memory cell;
supplying a sixth voltage to the first source/drain terminal of the memory cell; and
supplying the sixth voltage to the second source/drain terminal of the memory cell, wherein the fifth voltage is greater than the sixth voltage.

16. The method of claim 14, wherein closing the second switch of the source line driver couples a first terminal of a second inverter of the latch to the first source/drain terminal of the memory cell, a second terminal of the first inverter and a second terminal of the second inverter coupled to a common node.

17. A method of operating a memory device, the method comprising:
   during a read operation of a memory cell:
      supplying a threshold voltage to a word line terminal of the memory cell;
      closing a first switch of a source line driver to supply a first voltage to a first source/drain terminal of the memory cell; and
      supplying a read voltage to a second source/drain terminal of the memory cell, wherein:
         the threshold voltage is greater than the first voltage; and
         the read voltage is greater than the first voltage; and
   during a program operation of the memory cell:
      supplying a second voltage to the word line terminal of the memory cell;
      closing a second switch of the source line driver and opening the first switch to couple the first source/drain terminal of the memory cell to a latch to apply a third voltage at the latch to the first source/drain terminal of the memory cell, wherein closing the second switch of the source line driver couples a first terminal of a reset switch of the latch to the first source/drain terminal of the memory cell; and
      supplying a fourth voltage to the second source/drain terminal of the memory cell, wherein:
         the second voltage is greater than the third voltage, and
         the third voltage is greater than the fourth voltage.

18. The method of claim 17, comprising:
   during an erase operation of the memory cell:
      supplying a fifth voltage to the word line terminal of the memory cell;
      supplying a sixth voltage to the first source/drain terminal of the memory cell; and
      supplying the sixth voltage to the second source/drain terminal of the memory cell, wherein the fifth voltage is greater than the sixth voltage.

19. The method of claim 17, wherein closing the second switch of the source line driver couples a first terminal of a first inverter of the latch to the first source/drain terminal of the memory cell, a terminal of a second inverter of the latch and a second terminal of the first inverter coupled to a common node.

20. The method of claim 17, comprising:
   during an erase operation of the memory cell, closing the first switch to apply a fifth voltage to source line contacts of at least two columns of memory cells of the memory device, at least one of the at least two columns of memory cells comprising the memory cell.

* * * * *